(12) United States Patent
Sumino et al.

(10) Patent No.: US 6,680,763 B2
(45) Date of Patent: Jan. 20, 2004

(54) PHOTOSENSITIVE RESIN COMPOSITION AND LIQUID CRYSTAL DISPLAY COLOR FILTER

(75) Inventors: Tomonobu Sumino, Tokyo-to (JP); Akira Inoue, Tokyo-to (JP)

(73) Assignee: Dai Nippon Printing Co., LTD, Tokyo-to (JP)

( * ) Notice: Subject to any disclaimer, the term of this patent is extended or adjusted under 35 U.S.C. 154(b) by 11 days.

(21) Appl. No.: 09/962,518

(22) Filed: Sep. 25, 2001

(65) Prior Publication Data

US 2002/0060771 A1 May 23, 2002

(30) Foreign Application Priority Data

Sep. 29, 2000 (JP) .......................... 2000-298457
May 1, 2001 (JP) .......................... 2001-134024

(51) Int. Cl.[7] ............................................. G02F 1/1335
(52) U.S. Cl. ........................ 349/106; 349/84; 349/104
(58) Field of Search ........................... 349/84, 104, 106

(56) References Cited

FOREIGN PATENT DOCUMENTS

| EP | 0 864 910 | * | 9/1998 |
| EP | 1048972 | | 11/2000 |
| JP | 4318816 | | 11/1992 |
| JP | 10142610 | | 5/1998 |
| JP | 11242225 | | 9/1999 |
| WO | WO 9618130 | | 6/1996 |

* cited by examiner

Primary Examiner—Alexander Ghyka
(74) Attorney, Agent, or Firm—Ladas & Parry

(57) ABSTRACT

A photosensitive resin composition which enables the formation of a pattern manifesting large elastic deformation ratio and small plastic deformation ratio in a wider temperature range, and a color filter which enables the production of a liquid crystal display having a columnar convex part for setting the thickness of a liquid crystal layer and having excellent display qualities are provided. A photosensitive resin composition comprises at least a polymer, a poly-functional acrylate monomer and a photopolymerization initiator, wherein the content of the poly-functional acrylate monomer is from 50 to 70% by weight. A photosensitive resin composition comprises at least a polymer, a monomer having an unsaturated double bond, a photopolymerization initiator, and an alicyclic compound-containing resin, wherein the alicyclic compound is a compound having a poly-cyclic steric structure. A color filter comprises a colored layer a plurality of colors formed on a substrate in a predetermined pattern, and a plurality of columnar convex parts, wherein the columnar convex part manifests an elastic deformation ratio [(elastic deformation amount/total deformation amount)×100] ranging from 40 to 60% and an initial deformation ratio [(initial deformation amount/original thickness)×100] ranging from 10 to 30%, at a temperature of 180° C.

9 Claims, 5 Drawing Sheets

PHOTOSENSITIVE RESIN COMPOSITION AND LIQUID CRYSTAL DISPLAY COLOR FILTER

BACKGROUND OF THE INVENTION

The present invention relates to a color filter which enables the production of a liquid crystal display excellent in display qualities, and a photosensitive resin composition for forming a pattern which can be used for the production of this color filter.

Recently, a color liquid crystal display apparatus is noticed as a flat display. As one example of the color liquid crystal display apparatus, an apparatus is exemplified in which a color filter constituted of a black matrix, a colored layer of a plurality of colors (usually, three primary colors of red (R), green (G) and blue (B)), an orientation layer and a transparent conductive layer (common electrode), and a TFT array substrate constituted of a thin film transistor (TFT element), a picture element electrode and an orientation layer are allowed to face each other at a predetermined clearance, and a liquid crystal material is injected into this clearance part to give a liquid crystal layer. In such a color liquid crystal display apparatus, the clearance part constitutes the thickness itself of the liquid crystal layer, and for enabling excellent display abilities such as high speed responsiveness, high contrast ratio, wide visibility angle and the like required for color liquid crystal display apparatuses, it is necessary to strictly keep the thickness of the liquid crystal layer, namely, the clearance distance between the color filter and the TFT array substrate at a constant value.

Conventionally, as a method of determining the thickness of a liquid crystal layer in a color liquid crystal display apparatus, there is a method in which particles or rod bodies, called spacer, made of glass, alumina, plastic and the like are dispersed in large amount on a color filter or a TFT array substrate, the color filter and TFT array substrate are pasted and a liquid crystal is injected between them. The size of the clearance part between both substrates, namely, the thickness of a liquid crystal layer is determined by the size of the spacer.

However, in the above-mentioned method of forming a clearance part between a color filter and a TFT array substrate, the following problems occur regarding the motion of a color liquid crystal display apparatus. Namely, a clearance part having uniform size over the whole surface of the color liquid crystal display apparatus is not formed, unless the density of a spacer dispersed on the surface of a substrate is appropriate and spacers are dispersed uniformly on the surface of a substrate. In general, when the dispersion amount (density) of a spacer is increased, the uneven variation in thickness of the clearance part decreases, however, when the dispersion amount (density) is increased, the number of spacers present on display picture element part also increases, and this spacer constitutes a foreign matter in a liquid crystal material at the display picture element part. Owing to the presence of the spacer, disturbance occurs in the orientation of a liquid crystal molecule regulated by an orientation film, liquid crystal only around the spacer shows a problem that orientation control by ON and OFF of voltage becomes impossible, and the like, and a problem is found that display abilities such as contrast ratio and the like decrease.

To solve such problems, a color filter equipped with a columnar convex part for determining clearance (thickness of a liquid crystal layer) is suggested (JP-A No. 4-318816, and the like). In this color filter, a colored layer is formed, a protective layer is formed so as to cover this colored layer, then, a columnar convex part is formed at a predetermined position on a black matrix by a photolithography process using a photosensitive resin.

In general, a photosensitive resin used in conducting pattern formation by pattern exposure and development contains a monomer, polymer and photopolymerization initiator. However, the above-mentioned columnar convex part formed by using such a conventional photosensitive resin has a problem that, under high temperature and high pressure in fabricating (cell press fitting) a color filter and TFT array substrate, plastic deformation amount increases, causing a deterioration in a function as a spacer. Further, if the hardness of the columnar convex part is enhanced for solving this problem, this part cannot follow the shrinkage of liquid crystal in a wide practical temperature range (−20 to 40° C.) and foaming occurs in the liquid crystal layer, leading to a problem of reduction in display qualities such as decoloring, uneven color and the like.

SUMMARY OF THE INVENTION

The present invention has been achieved in order to solve the above problems. It is an object of this invention to provide a photosensitive resin composition which enables the formation of a pattern manifesting large elastic deformation ratio and small plastic deformation ratio in a wider temperature range, and a color filter which enables the production of a liquid crystal display having a columnar convex part for setting the thickness of a liquid crystal layer and having excellent display qualities.

For attaining such an object, a liquid crystal display color filter of the present invention has a constitution comprising a substrate, a colored layer of a plurality of colors formed on the substrate in a predetermined pattern, and a plurality of columnar convex parts, wherein the columnar convex part manifests an elastic deformation ratio [(elastic deformation amount/total deformation amount)×100] ranging from 40 to 60% and an initial deformation ratio [(initial deformation amount/original thickness)×100] ranging from 10 to 30%, at a temperature of 180° C.

The photosensitive resin composition of the present invention has a constitution comprising at least a polymer, poly-functional acrylate monomer and a photopolymerization initiator, wherein the content of the poly-functional acrylate monomer is in the range from 50 to 70% by weight.

Further, the photosensitive resin composition of the present invention has a constitution comprising at least a polymer, a monomer having an unsaturated double bond, a photopolymerization initiator and an alicyclic compound-containing resin, wherein the alicyclic compound-containing resin contains as an alicyclic compound a compound having a poly-cyclic steric structure.

In another embodiment of the above-mentioned photosensitive resin composition, the above-mentioned alicyclic compound-containing resin is obtained by polymerizing a monomer prepared by adding a vinyl group and/or an isopropenyl group to the above-mentioned alicyclic compound.

In still another embodiment of the above-mentioned photosensitive resin composition, the above-mentioned monomer is a poly-functional acrylate monomer, and the above-mentioned vinyl group and isopropenyl group have a carboxyl group on one of double bond carbons.

In further another embodiment of the above-mentioned photosensitive resin composition, an epoxy compound is contained in the composition.

In the present invention thus described above, a poly-functional acrylate monomer contained at predetermined high concentration in a photosensitive resin composition, or an alicyclic compound-containing resin contained in a photosensitive resin composition, imparts a large elastic deformation ratio and a small plastic deformation ratio in a wider temperature range to a pattern, and a columnar convex part formed by using this photosensitive resin composition manifests small plastic deformation amount under high temperature and high pressure in cell press fixing and can follow the shrinkage of liquid crystal in a wider temperature range (−20 to 40° C.), causing no deterioration in a function as a spacer.

As described above, according to the present invention, the concentration of a poly-functional acrylate monomer contained in a photosensitive resin composition is as high as 50 to 70% by weight or a photosensitive resin composition contains an alicyclic compound-containing resin, therefore, a pattern formed by performing exposure, development and heating treatment manifest large elastic deformation ratio and small plastic deformation ratio in a wider temperature range. In a color filter having a plurality of columnar convex parts formed by using this photosensitive resin composition, the columnar convex part has an elastic deformation rate [(elastic deformation amount/total deformation amount)× 100] of from 40 to 60% and an initial deformation rate [(initial deformation amount/original thickness)×100] of from 10 to 30% at 180° C., the plastic deformation amount under high temperature and high pressure in cell press fitting is small, the convex part can follow the shrinkage of liquid crystal in a wider temperature range (−20 to 40° C.) and an function as a spacer can be maintained constantly. Therefore, the color filter of the present invention can be applied also to color liquid crystal displays in which high precision in control of the thickness of a liquid crystal layer is required, for example, to color liquid crystal displays of IPS (In-Plane Switching) liquid crystal mode, and color liquid crystal displays excellent in display quality and having high reliability can be obtained.

DETAILED DESCRIPTION OF THE PREFERRED EMBODIMENTS

The best modes of the present invention will be illustrated referring to drawings.

Color Filter

Figure 1:
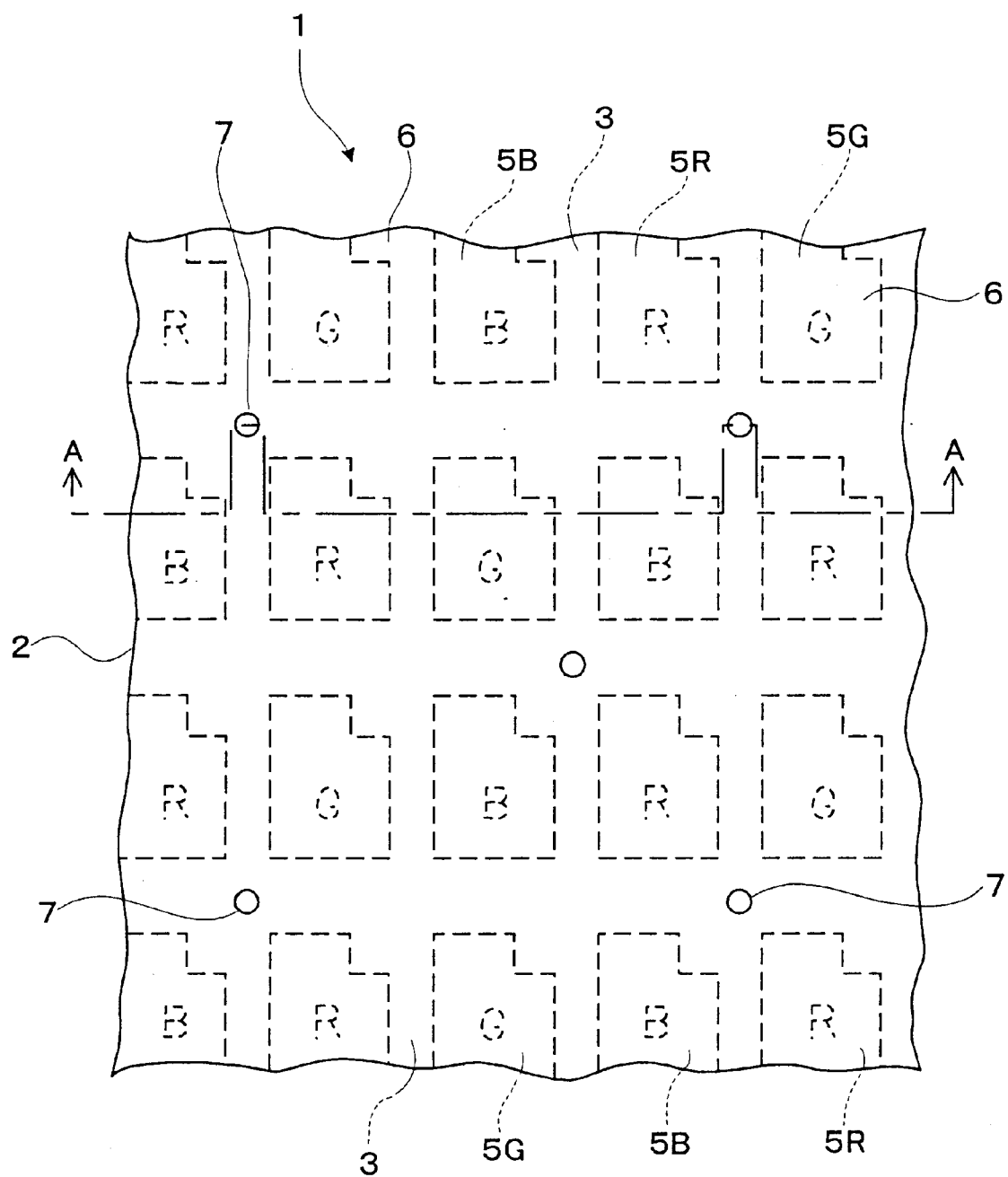
FIG. 1 is a partial plan view showing one embodiment of a color filter of the present invention.
Figure 2:
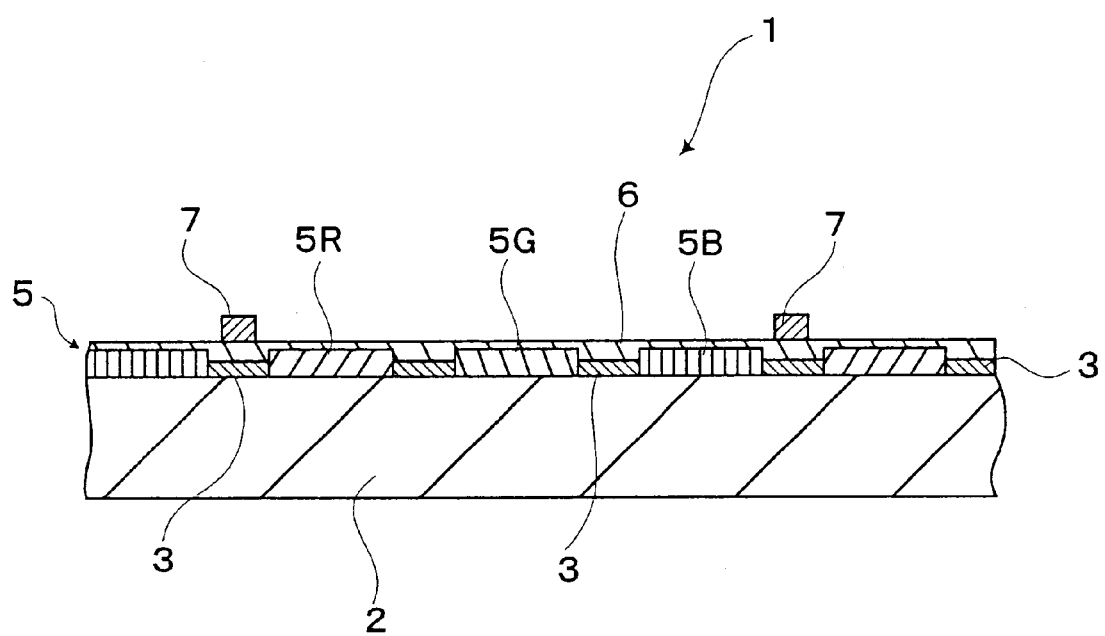
FIG. 2 is a longitudinal sectional view along A–A line of a color filter of the present invention shown in FIG. 1.

FIG. 1 is a partial plan view showing one embodiment of the color filter of the present invention, and FIG. 2 is a longitudinal sectional view along A–A line. In FIGS. 1 and 2, a color filter 1 of the present invention has a substrate 2 and, a black matrix 3 and colored layers 5 formed on this substrate 2, and a transparent protective layer 6 is so formed as to cover the black matrix 3 and colored layers 5, further, transparent columnar convex parts 7 are formed on the above-mentioned transparent protective layer 6 at a plurality of given positions (5 positions in FIG. 1) of the black matrix 3.

As the substrate 2 constituting the above-mentioned color filter 1, transparent rigid materials having no plasticity such as quartz glass, Pyrex glass, synthetic quartz plate and the like, or transparent flexible materials having plasticity such as a transparent resin film, optical resin and the like, can be used. Of them, 1737 glass manufactured by Corning Corp. is suitable for a color filter to be used in color liquid crystal display apparatus according to an active matrix method since it is a raw material having small thermal expansion coefficient, is excellent in dimension stability and workability in high temperature heating treatment, and is non-alkali glass containing no alkali component in glass.

The black matrix 3 constituting the color filter 1 is provided between display picture elements composed of colored layers 5 and on the outside of a forming region for the colored layer 5. Such a black matrix 3 may be any of those obtained by forming a metal thin film layer of chromium and the like having a thickness from about 1000 to 2000 Å by a sputtering method, a vacuum vapor deposition method and the like and patterning this thin film, those obtained by forming a layer of a resin such as a polyimide resin, acrylic resin, epoxy resin and the like containing shading particles such as carbon fine particles and the like and patterning this resin layer, and those obtained by forming a photosensitive resin layer containing shading particles such as carbon fine particles, metal oximes and the like and patterning this photosensitive resin layer.

The colored layer 5 is composed of a red pattern 5R, green pattern 5G and blue pattern 5B arranged in a described pattern form, and can be formed by a pigment dispersion method using a photosensitive resin containing desired coloring materials, and further, can be formed by known methods such as a printing method, electrode position method, transfer method and the like. Further, suitable liquid crystal layer thickness for each color of the colored layer 5 may be set so that the red pattern 5R is most thin, and the thickness increases in the order of the green pattern 5G and blue pattern 5B.

The transparent protective layer 6 is provided for flattening the surface of the color filter 1 and for preventing elution components contained in the colored layer 5 into a liquid crystal layer. The thickness of the transparent protective layer 6 can be set in view of the light transmittance of a material used, the surface condition of the color filter 1, and the like, for example, in the range from 0.1 to 2.0 μm. Such a transparent protective layer 6 is so formed as to cover at least the colored layer 5 coming in contact with a liquid crystal layer when the color filter 1 is pasted to a TFT array substrate.

The columnar convex part 7 acts as a spacer when the color filter 1 is pasted with the TFT array substrate. The color filter of the present invention is characteristic in that it manifests an elastic deformation ratio [(elastic deformation amount/total deformation amount)×100] ranging from 40 to 60% and an initial deformation ratio [(initial deformation amount/original thickness)×100] ranging from 10 to 30%, at a temperature of 180° C. Regarding this, explanations will be made referring to FIG. 3. In the present invention, onto a columnar convex part sample having an upper end area of 100 μm$^2$ and a thickness T of 5.0 μm, a load is applied up to 40 mN at 180° C. toward the thickness direction at a rate of 2.2 mN/sec. and kept for 5 seconds, then, a load is removed toward the thickness direction at a rate of 2.2 mN/sec. and kept for 5 seconds, and the deformation amount (μm) at this point is measured by F ischerscope H-100 manufactured by Fischer Instruments K.K. (using an indenter having a plane of 100 μm×100 μm obtained by polishing a Vickers indenter (4-side pyramid form)).

Figure 3:
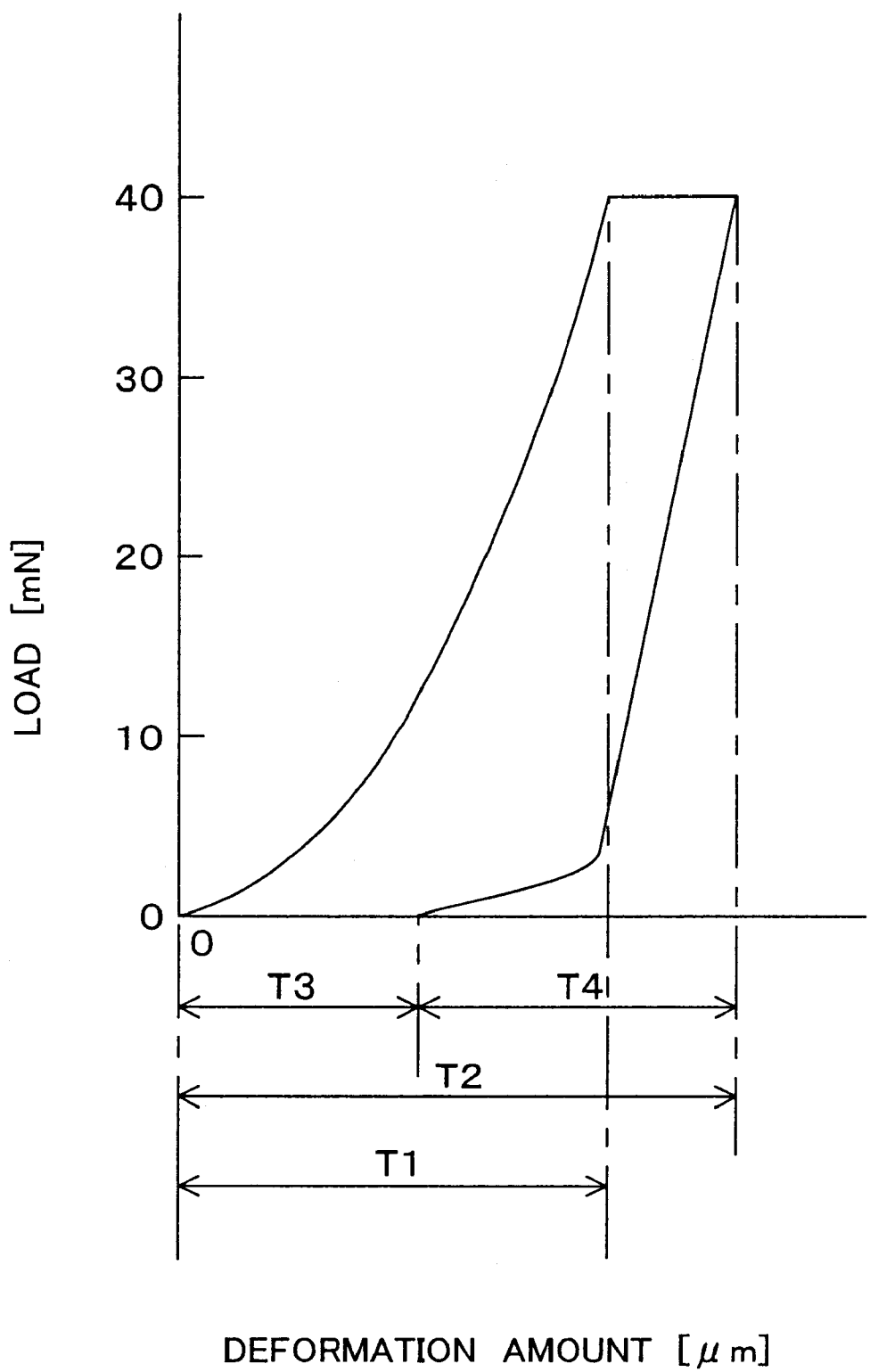
FIG. 3 is a view showing the relation between load and deformation amount.

FIG. 3 is a view showing a relation between such a load and a deformation amount, and the deformation amount when a load of up to 40 mN is imparted is represented by the initial deformation amount T1, the deformation amount when a load of 40 mN is kept for 5 seconds is represented by the total deformation amount T2, the deformation amount which remains when a load is removed is represented by the plastic deformation amount T3, and the difference between the total deformation amount T2 and the plastic deformation amount T3 is represented by the elastic deformation amount T4. Therefore, the above-mentioned elastic deformation ratio is represented by [(T4/T2)×100] and the initial deformation ratio is represented by [(T1/T)×100]. When the elastic deformation ratio of the columnar convex part 7 is less than 40% and the initial deformation ratio is over 30%, the plastic deformation amount increases and uniform formation of the columnar convex part 7 becomes difficult, under high temperature and high pressure in fabricating with the TFT array substrate (cell press fitting). Further, when the initial deformation ratio is less than 10%, the columnar convex part 7 cannot follow the shrinkage of liquid crystal in a wider temperature range (for example, −20 to 40° C.) and cannot manifest the function as a spacer sufficiently. On the other hand, when the elastic deformation amount of the columnar convex part 7 is over 60%, the height of the columnar convex part 7 becomes irregular, and uneven pressure in cell press fitting cannot be relaxed or absorbed, leading to generation of uneven gap (ununiformity of clearance between substrates), undesirably.

The above-mentioned columnar convex part 7 has a constant height so that it protrudes from the above-mentioned transparent protective layer 6 by about 2 to 10 μm, and the protrusion amount can be appropriately set depending on the thickness required for a liquid crystal layer of a color liquid crystal display apparatus, and the like. The breadth of the columnar convex part 7 can be appropriately set within the range from about 5 to 20 μm, and the formation density of the columnar convex part 7 can be appropriately set in view of the uneven thickness of the liquid crystal layer, aperture rate, form of the columnar convex part 7, materials, and the like. For example, a spacer function is manifested which is necessary and sufficient at a rate of one per one combination of a red pattern 5R, a green pattern 5G and a blue pattern 5B constituting the colored layer 5. The form of such a columnar convex part 7 is a cylindrical form in the illustrated example, however, it is not limited to this form, and a prismatic form, truncated pyramidical form and the like are permissible.

Such a columnar convex part 7 can be formed by using a photosensitive resin composition of the present invention described later.

The color filter of the present invention may also be one which does not have a black matrix 3 and in which the above-mentioned columnar convex part 7 is formed at a position corresponding to non-image part.

In the above-mentioned embodiment of a color filter, the columnar convex part 7 is formed in the form of island on the transparent protective layer 6, however, the transparent protective layer 6 and the transparent columnar convex part 7 may also be formed integrally.

First Invention of Photosensitive Resin Composition

The photosensitive resin composition of the present invention contains at least a poly-functional acrylate monomer, polymer, and photopolymerization initiator.

As the poly-functional acrylate monomer constituting the photosensitive resin composition of the present invention, dipentaerythritol hexa(meth)acrylate, dipentaerythritol penta(meth)acrylate, pentaerythritol tetra(meth)acrylate and the like are listed.

In the present invention, the content of such a poly-functional acrylate monomer is in the range from 50 to 70% by weight based on the total weight of solid components in the photosensitive resin composition. When the content of the poly-functional acrylate monomer is less than 50% by weight, a pattern formed by performing exposure, development and heating treatments on a photosensitive resin composition of the present invention shows a smaller elastic deformation ratio, and formation of a pattern having a large elastic deformation ratio (for example, 40 to 60%) and a small plastic deformation ratio (for example, 60 to 40%) in a wider temperature range becomes difficult. Here, the elastic deformation ratio means [(T4/T2)×100] and the plastic deformation ratio means [(T3/T2)×100] in the above-mentioned explanations. On the other hand, when the content of the poly-functional acrylate monomer is over 70% by weight, uniform formation of a pattern in the form of a fine spacer becomes difficult, which is a cause of uneven gap in cell fabrication, undesirably.

As the polymer constituting the photosensitive resin composition of the present invention, there are listed an ethylene-vinyl acetate copolymer, ethylene-vinyl chloride copolymer, ethylene-vinyl copolymer, polystyrene, acrylonitrile-styrene copolymer, ABS resin, polymethacrylic acid resin, ethylene methacrylic acid resin, polyvinyl chloride resin, chlorinated vinyl chloride, polyvinyl alcohol, cellulose acetate propionate, cellulose acetate butyrate, nylon 6, nylon 66, nylon 12, polyethylene terephthalate, polybutylene terephthalate, polycarbonate, polyvinyl acetal, polyether ether ketone, polyether sulfone, polyphenylene sulfide, polyallylate, polyvinylbutyral, epoxy resin, phenoxy resin, polyimide resin, polyamideimide resin, polyamic acid resin, polyether imide resin, phenol resin, urea resin and the like, and polymers or copolymers composed of one or more of polymerizable monomers, methyl acrylate, methyl methacrylate, ethyl acrylate, ethylmethacrylate, n-propylacrylate, n-propyl methacrylate, isopropyl acrylate, isopropyl methacrylate, sec-butyl acrylate, sec-butyl methacrylate, isobutyl acrylate, isobutyl methacrylate, tert-butyl acrylate, tert-butyl methacrylate, n-pentyl acrylate, n-pentyl methacrylate, n-hexyl acrylate, n-hexyl methacrylate, 2-ethylhexyl acrylate, 2-ethylhexyl methacrylate, n-octyl acrylate, n-octyl methacrylate, n-decylacrylate, n-decylmethacrylate, styrene, α-methylstyrene, N-vinyl-2-pyrrolidone and glycidyl (meth) acrylate, with one or more of acrylic acid, methacrylic acid, dimmer of acrylic acid (for example, M-5600 manufactured by Toagosei Co., Ltd.), itaconic acid, chrotonic acid, maleic acid, fumaric acid, vinylacetic acid, acid anhydrides thereof and the like, and other polymers.

Further, polymers obtained by adding an ethylenically unsaturated compound having a glycidyl group or a hydroxyl group to the above-mentioned copolymers are listed, however, there is no limitation to these listed polymers.

The content of such a polymer can be set within the range from 10 to 40% by weight based on the total weight of solid components in the photosensitive resin composition.

As the photopolymerization initiator constituting the photosensitive resin composition of the present invention, there are listed combinations of photoreductive coloring matters such as benzophenone, methyl o-benzoylbenzoate, 4,4-bis (dimethylamine)benzophenone, 4,4-bis(diethylamine) benzophenone, α-amino/acetophenone, 4,4-dichlorobenzophenone, 4-benzoyl-4-methyldiphenylketone, dibenzylketone, fluorenone, 2,2-diethoxyacetophenone, 2,2-dimethoxy-2-phenylacetophenone, 2-hydroxy-2-methylpropiophenone, p-tert-butyldichloroacetophenone, thioxanetone, 2-methylthioxanetone, 2-chlorothioxanetone, 2-isopropylthioxanetone, diethylthioxanetone, benzyldimethyl ketal, benzylmethoxyethyl acetal, benzoinmethyl ether, benzoin butyl ether, anthraquinone, 2-teributylanthraquinone, 2-amylanthraquinone, β-chloroanthraquinone, anthrone, benzanthrone, dibenzsuberone, methyleneanthrone, 4-azidebenzylacetophenone, 2,6-bis(p-azidebenzylidene) cyclohexane, 2,6-bis(p-azidebenzylidene)-4-methylcyclohexanone, 2-phenyl-1,2-butadione-2-(o-methoxycarbonyl) oxime, 1-phenyl-propanedione-2-(o-ethoxycarbonyl) oxime, 1,3-diphenyl-propanetrione-2-(o-ethoxycarbonyl) oxime, 1-phenyl-3-ethoxy-propanetrione-2-(o-benzoyl) oxime, Michler's ketone, 2-methyl-1-[4-(methylthio)phenyl]-2-morpholinopropane-1-one, 2-benzyl-2-dimethylamino-1-(4-morpholinophenyl)-butanone, naphthalenesulfonyl chloride, quinolinesulfonyl chloride, n-phenylthioacridone, 4,4-azobisisobutyronitrile, diphenyl disulfide, benzthiazoledisulfide, triphenylphosphine, camphor quinone, N1717 manufactured by Adeca K.K., carbon tetrabromide, tribromophenylsulfone, benzoinperoxime, eosin, methylene blue and the like, with reducing agents such as ascorbic acid, triethanolamine, and the like, are listed. In the present invention, these photopolymerization initiators can be used alone or in combination of two or more.

The content of such a photopolymerization initiator can be set within the range from 5 to 20% by weight based on the total weight of solid components in the photosensitive resin composition.

The photosensitive resin composition of the present invention can contain an epoxy resin. As the epoxy resin used, there can be listed Epicoat series manufactured by Mitsubishi Yuka Shell K.K., Celloxide series and Epo lead series manufactured by Dicel Corp., or, bisphenol-A type epoxy resin, bisphenol-F type epoxy resin, bisphenol-S type epoxy resin, novolak type epoxy resin, glycidyl polycarboxylate, polyol glycidyl ester, aliphatic or alicyclic epoxy resin, amine epoxy resin, triphenolmethane type epoxy resin, dihydroxybenzene type epoxy resin, copolymerized epoxy resins with a monomer which can be radical-polymerizable with glycidyl (meth)acrylate, and the like. In the present invention, the above-mentioned epoxy resins can be used alone or in admixture of two or more.

The content of such an epoxy resin can be set within the range from 0 to 10% by weight based on the total weight of solid components in the photosensitive resin composition.

Given as examples of the solvent used in the photosensitive resin composition of the present invention are alcohols such as methanol, ethanol, n-propanol, isopropanol, propanol, ethylene glycol, propylene glycol and the like; terpenes such as α- or β-terpineol; ketones such as acetone, methyl ethyl ketone, cyclohexanone, N-methyl-2-pyrrolidone and the like; aromatic hydrocarbons such as toluene, xylene, tetramethylbenzene and the like; glycol ethers such as cellosolve, methylcellosolve, ethylcellosolve, carbitol, methylcarbitol, ethylcarbitol, butylcarbitol, propylene glycol monomethyl ether, propylene glycol monoethyl ether, dipropylene glycol monomethyl ether, dipropylene glycol monoethyl ether, triethylene glycol monomethyl ether, triethylene glycol monoethyl ether and the like; acetates such as ethyl acetate, butyl acetate, cellosolve acetate, ethylcellosolve acetate, butylcellosolve acetate, carbitol acetate, ethylcarbitol acetate, butylcarbitol acetate, propylene glycol monomethyl ether acetate, propylene glycol monoethyl ether acetate and the like; and other solvents.

Second Invention of Photosensitive Resin Composition

The photosensitive resin composition of the present invention contains at least a polymer, a monomer having an unsaturated double bond, a photopolymerization initiator and an alicyclic compound-containing resin.

The alicyclic compound constituting the above-mentioned alicyclic compound-containing resin is a compound containing 7 to 10 carbon atoms and having a poly-cyclic steric structure containing a plurality of rings formed of carbon atoms, and examples thereof include adamantyl groups of the following structural formula (1), norbornyl groups of the following structural formula (2), tricyclodecanyl groups of the following structural formula (3), quadricyclyl groups of the following structural formula (4) and cubayl groups of the following structural formula (5), and the like.

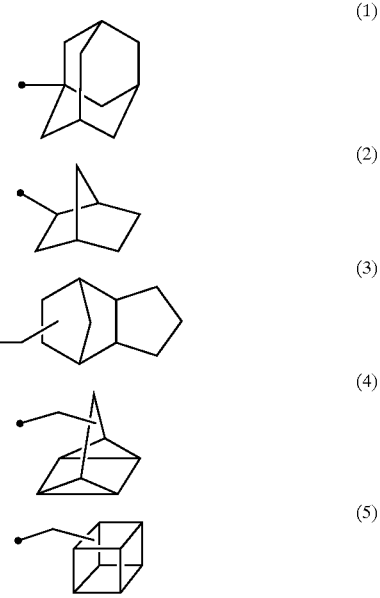

The alicyclic compound-containing resin used in the present invention is a polymer obtained by radical-polymerizing a monomer prepared by adding a vinyl group and/or an isopropenyl group to the above-mentioned alicyclic compound, for example, methyladamantyl (meth) acrylate, isonorbornyl (meth) acrylate, tricyclodecanyl (meth) acrylate, quadricyclyl (meth) acrylate, cubayl (meth) acrylate and the like. The content of the alicyclic compound contained in the alicyclic compound-containing resin is preferably in the range from about 15 to 40% by weight.

Such an alicyclic compound-containing resin has a molecular weight of from 2000 to 50000, preferably from 20000 to 40000, and is preferably contained in an amount of from about 40 to 70% by weight based on the weight of solid components in the photosensitive resin composition excepting photopolymerization initiators. The solid components in the photosensitive resin composition of the present invention mean a photopolymerization initiator, a monomer having an unsaturated double bond, an alicyclic compound-containing resin, and an epoxy resin contained if necessary.

Since the photosensitive resin composition of the present invention contains the alicyclic compound-containing resin as described above, a pattern formed by performing exposure, development and heating treatments on this photosensitive resin composition can have a large elastic deformation ratio (for example, 40 to 60%) and a small plastic deformation ratio (for example, 60 to 40%) in a wider temperature range. Here, the elastic deformation ratio means [(T4/T2)×100] and the plastic deformation ratio means [(T3/T2)×100], in the above-mentioned explanations regarding the color filter.

As the polymer constituting the photosensitive resin composition of the present invention, the same polymers as listed as the polymer constituting the above-mentioned photosensitive resin composition of the present invention can be used likewise. Such a polymer is preferably contained in an amount of from about 10 to 20% by weight based on the weight of solid components in the photosensitive resin composition excepting photopolymerization initiators.

Further, as the photopolymerization initiator constituting the photosensitive resin composition of the present invention, the same compounds as listed as the photopolymerization initiator constituting the above-mentioned photosensitive resin composition of the present invention can be used likewise. Such a photopolymerization initiator is preferably contained in an amount of from about 5 to 15 parts by weight based on 100 parts by weight of solid components in the photosensitive resin composition excepting photopolymerization initiators.

As the monomer having an unsaturated double bond contained in the photosensitive resin composition of the present invention, there are listed allyl acrylate, benzyl acrylate, butoxyethyl acrylate, butoxyethylene glycol acrylate, cyclohexyl acrylate, dicyclopentanyl acrylate, 2-ethylhexyl acrylate, glycerol acrylate, glycidyl acrylate, 2-hydroxyethyl acrylate, 2-hydroxypropyl acrylate, isobonyl acrylate, isodexyl acrylate, isooctyl acryalte, lauryl acrylate, 2-methoxyethyl acrylate, methoxyethylene glycol acrylate, phenoxyethyl acrylate, stearyl acrylate, ethylene glycoldiacrylate, diethylene glycol diacrylate, 1,4-butanediol diacrylate, 1,5-pentanediol diacrylate, 1,6-hexanediol diacrylate, 1,3-propanediol acrylate, 1,4-cyclohexanediol diacrylate, 2,2-dimethylolpropane diacrylate, glycerol diacrylate, tripropylene glycol diacrylate, glycerol triacrylate, trimethylolpropane triacrylate, polyoxyethylated trimethylolpropane triacrylate, pentaerythritol triacrylate, pentaerythritol tetraacrylate, triethylene glycol diacrylate, polyoxypropyl trimethylolpropane triacryalte, butylene glycol diacrylate, 1,2,4-butanetriol triacrylate, 2,2, 4-trimethyl-1,3-pentanediol diacrylate, diallyl fumarate, 1,10-decanediol dimethyl acrylate, pentaerythritol hexaacrylate and dipentaerythritol hexaacrylate, and those obtained by substituting acrylate in the above-mentioned compounds by methacrylate, γ-methacryloxypropyltrimethoxysilane, 1-vinyl-2-pyrrolidone, and the like. In the present invention, the above-mentioned monomers can be used singly or in admixture of two or more, or can be used as a mixture with other compounds.

Such a monomer is preferably contained in an amount of from about 25 to 40% by weight based on the weight of solid components in the photosensitive resin composition excepting photopolymerization initiators.

In the photosensitive resin composition of the present invention, it is possible that the monomer contained is a poly-functional acrylate monomer and a vinyl group and isopropenyl group of the monomer constituting the alicyclic compound-containing resin carry a carboxyl group on one of double bond carbons. By this, the heat shrinkage by heating in post-bake after exposure and development decreases, film reduction (reduction in bulk before and after post-bake) occurs uniformly, and a pattern having uniform thickness without swell in peripheral parts can be obtained. Further, alkali development becomes possible.

As the poly-functional acrylate monomer, the above-exemplified poly-functional acrylate monomers or poly-functional methacrylate monomers in a monomer can be used. Further, as alicyclic compound-containing resin in which a vinyl group and isopropenyl group carry a carboxyl group on one of double bond carbons, for example, copolymers containing (meth) acrylic acid and, one or more monomers of (meth) acrylic acid, (meth)acrylic ester, styrene and α-metylstyrene, and one ore more monomers of methyladamantyl (meth)acrylate, isonorbornyl (meth) acrylate, tricyclodecanyl (meth) acrylate, quadricyclyl (meth) acrylate and cubayl (meth) acrylate, and the like, are listed.

The photosensitive resin composition of the present invention can contain an epoxy resin. As the epoxy resin used, the above-mentioned compounds listed as the epoxy resin which can be used in the photosensitive resin composition of the present invention can be used like wise. Such an epoxy resin is preferably contained in an amount of from about 0 to 30% by weight based on the weight of solid components in the photosensitive resin composition excepting photopolymerization initiators.

In the photosensitive resin composition of the present invention, sensitizers, polymerization terminators, chain transfer agents, leveling agents, dispersing agents, plasticizers, surfactants, de-forming agents and the like are further used as additives, if necessary.

As the solvent used in the photosensitive resin composition of the present invention, the above-mentioned compounds listed as the solvent which is used in the photosensitive resin composition of the present invention can be used likewise.

The photosensitive resin composition of the present invention as described above can be produced by mixing the above-mentioned polymer, photopolymerization initiator, monomer and alicyclic compound-containing resin, solvent, and other resin components and additives, if necessary.

The photosensitive resin composition of the present invention as described above can be applied by known application devices such as a direct gravure coating method, gravure reverse coating method, reverse roll coating method, slide die coating method, slit die coating method, comma coating method and the like onto a pattern formation substance, and dried, and exposed and developed via a given mask, then, subjected to a heating treatment, to form a pattern. The formed pattern has large elastic deformation ratio and small plastic deformation ratio in a wider temperature range.

Next, production of a color filter 1 using the photosensitive resin composition of the present invention will be illustrated referring to FIGS. 4 and 5, also as illustration of pattern formation with the photosensitive resin composition of the present invention.

Figure 4A:
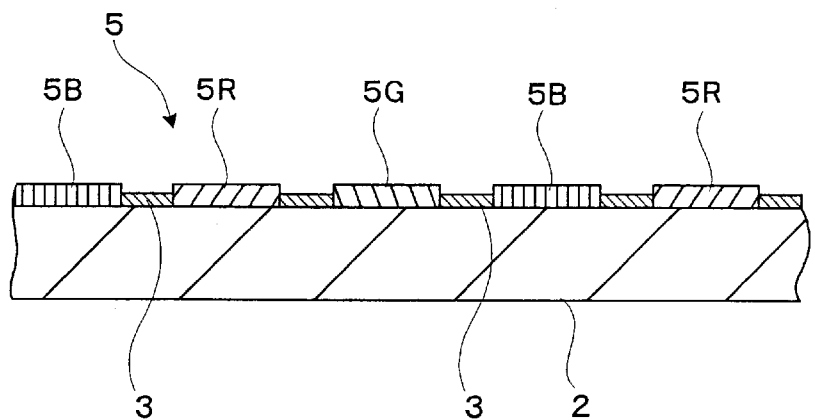
FIGS. 4A, B and C are a process view for illustrating an example of producing a color filter of the present invention.
Figure 4B:
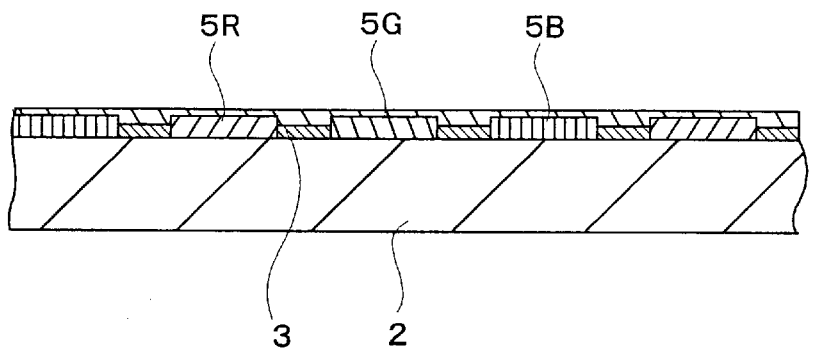
Figure 4C:
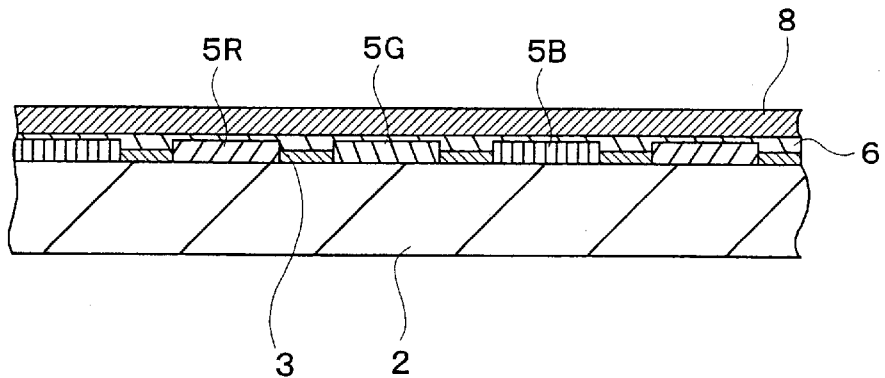

First, a black matrix 3 is formed on a substrate 2, then, a red pattern 5R is formed in a red pattern formation region, a green pattern 5G is formed in a green pattern formation region and a blue pattern 5B is formed in a blue pattern formation region, on the substrate, to give a colored layer 5 (FIG. 4(A)). Then, a negative transparent photosensitive resin layer is so formed as to cover the black matrix 3 and the colored layer 5, and the layer is exposed to form a transparent protective layer 6 (FIG. 4(B)). Then, the photosensitive resin composition of the present invention is applied so as to cover the transparent protective layer 6, to form a photosensitive resin layer 8 (FIG. 4(C)).

Formation of the above-mentioned black matrix 3 can be conducted as described below, for example. First, a metal film made of chromium and the like formed by a sputtering method, vacuum vapor deposition method and the like, and a shading layer made of a resin layer containing shading particles such as carbon fine particles, and the like, are formed on the substrate 2, and a photosensitive resist layer is formed on this shading layer using a known positive or negative photosensitive resist. Then, the photosensitive resist layer is exposed via a photomask for back matrix, and developed, and the exposed shading layer is etched, then, the remaining photosensitive resist layer is removed, to form a black matrix layer 3. Further, the black matrix 3 can also be formed by using a photosensitive resist containing shading particles such as carbon fine particles and the like, and effecting exposure via a photomask for black matrix, development, and a heating treatment.

Formation of the above-mentioned colored layer 5 can be conducted as described below, for example. First, a red photosensitive resin layer containing a red coloring material is so formed on the substrate 2 as to cover the black matrix 3, and the above-mentioned red photosensitive resin layer is exposed via a pre photomask and developed, to form a red pattern 5R in a red pattern formation region on the substrate 2. Hereinafter, a green pattern 5G is formed in a green pattern formation region on the substrate 2 and a blue pattern 5B is further formed in a blue pattern formation region on the substrate 2, likewise.

Further, the above-mentioned transparent protective layer 6 can be formed, for example, as follows. A known negative transparent photosensitive resin composition is, after optimization of viscosity, applied by known devices such as a spin coater, roll coater and the like so as to cover the black matrix 3 and the colored layer 5, and a hardening treatment is performed by exposure, to form the layer 6.

Further, the above-mentioned photosensitive resin layer 8 can be formed by applying a photosensitive resin composition of the present invention by known application devices such as a direct gravure coating method, gravure reverse coating method, reverse roll coating method, slide die coating method, slit die coating method, comma coating method and the like, and drying the composition.

Figure 5A:
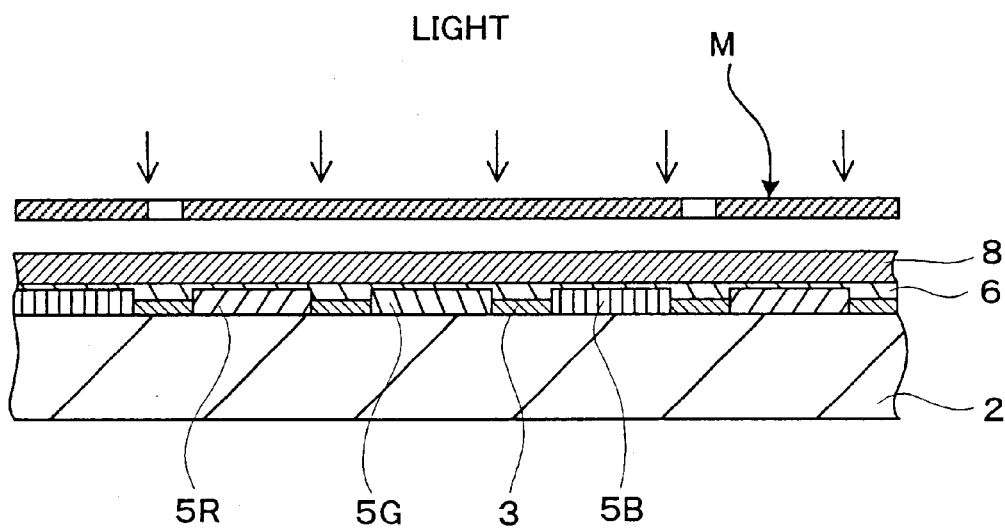
FIGS. 5A and B are a process view for illustrating an example of producing a color filter of the present invention.
Figure 5B:
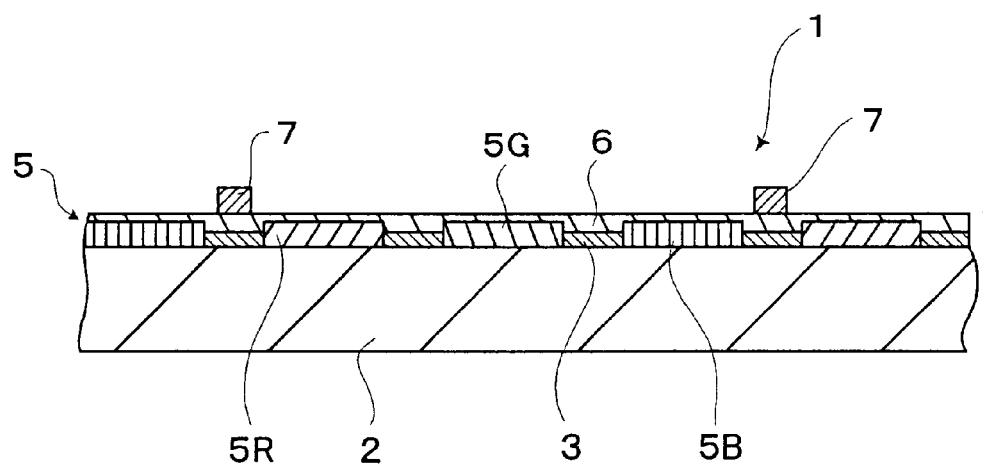

Next, the photosensitive resin layer 8 is exposed via a photomask M for formation of columnar convex parts (FIG. 5(A)). The photomask M used has aperture parts at given positions, for formation of columnar convex parts 7.

Then, the photosensitive resin layer 8 is developed by a developer. By this development, the photosensitive resin layer 8 at a columnar convex part formation position remains as a pattern of a columnar convex part without being dissolved. Then, the columnar convex part 7 is completed by a heating treatment (post-bake), to obtain the color filter 1 of the present invention (FIG. 5(B)).

When an orientation treatment (rubbing) is effected by providing an orientation layer on the color filter 1 equipped with the above-mentioned columnar convex part 7 before being laminated with TFT array substrate (cell press fitting), the columnar convex part 7 forms a clearance between the color filter 1 and the TFT array substrate. In the color filter 1 of the present invention, since the columnar convex part 7 has an elastic deformation rate [(elastic deformation amount/total deformation amount)×100] of from 40 to 60% and a deformation rate [(initial deformation amount/original thickness)×100] of from 10 to 30% at 180° C, the plastic deformation amount under high temperature and high pressure in cell press fitting is small, the part 7 can follow the shrinkage of liquid crystal at lower temperatures (−20 to −40° C.) and an function as a spacer is maintained, and the clearance precision between substrates is extremely high.

EXAMPLES

The present invention will be illustrated further in detail below by examples.

Example 1

First, as the photosensitive resin composition, the following five photosensitive resin compositions 1-A, 1-B, 1-C, 1-D and 1-E were prepared in which the content of a poly-functional acrylate monomer is varied as shown in Table 1 shown below.

| Formulation of photosensitive resin composition 1-A | |
|---|---|
| Polymer | 40 parts by weight |
| (radical copolymer of styrene-methyl methacrylate-methacrylic acid) | |
| Poly-functional acrylate monomer | 40 parts by weight |
| (dipentacrythritol hexaacrylate) | |
| Photopolymerization initiator | 10 parts by weight |
| (Irgacure 369 (manufactured by Chiba Specialty Chemicals)) | |
| Epoxy resin | 10 parts by weight |
| (Epicoat 180S70 (manufactured by Mitsubishi Yuka Shell)) | |
| Formulation of photosensitive resin composition 1-B | |
| Polymer | 30 parts by weight |
| (radical copolymer of styrene-methyl methacrylate-methyl methacrylic acid)) | |
| Poly-functional acrylate monomer | 50 parts by weight |
| (dipentarythritol hexaacrylate) | |
| Photopolymerization initiator | 10 parts by weight |
| (Irgacure 369 (manufactured by Chiba Specialty Chemicals)) | |
| Epoxy resin | 10 parts by weight |
| (Epicoat 180S70 (manufactured by Mitsubishi Yuka Shell)) | |
| Formulation of photosensitive resin composition 1-C | |
| Polymer | 20 parts by weight |
| (radical copolymer of styrene-methyl methacrylate-methacrylic acid) | |
| Poly-functional acrylate monomer | 60 parts by weight |
| (dipentarythritol hexaacrylate) | |
| Photopolymerization initiator | 10 parts by weight |
| (Irgacure 369 (manufactured by Chiba Specialty Chemicals)) | |
| Epoxy resin | 10 parts by weight |
| (Epicoat 180S70 (manufactured by Mitsubishi Yuka Shell)) | |
| Formulation of photosensitive resin composition 1-D | |
| Polymer | 10 parts by weight |
| (radical copolymer of styrene-methyl methacrylate-methacrylic acid) | |
| Poly-functional acrylate monomer | 70 parts by weight |
| (dipentarythritol hexaacrylate) | |
| Photopolymerization initiator | 10 parts by weight |
| (Irgacure 369 (manufactured by Chiba Specialty Chemicals)) | |
| Epoxy resin | 10 parts by weight |
| (Epicoat 180S70 (manufactured by Mitsubishi Yuka Shell)) | |
| Formulation of photosensitive resin composition 1-E | |
| Polymer | 10 parts by weight |
| (radical copolymer of styrene-methyl methacrylate-methacrylic acid) | |
| Poly-functional acrylate monomer | 80 parts by weight |
| (dipentarythritol hexaacrylate) | |
| Photopolymerization initiator | 10 parts by weight |
| (Irgacure 369 (manufactured by Chiba Specialty Chemicals)) | |

Next, the above-mentioned photosensitive resin compositions (1-A, 1-B, 1-C, 1-D, 1-E) were applied on a polyimide substrate by a spin coating method, and the compositions were exposed at en exposure amount of 100 mJ/cm$^2$ via a photomask having an aperture part of given form, developed and subjected to heating treatment (230° C., 30 minutes). By this, pattern samples having an upper end area of 100 μm$^2$, and a thickness T of 5.0 μm were produced. Then, a load was applied at 180° C. along the thickness direction at a rate of 2.2 mN/sec. up to 40 mN on the pattern samples, and kept at five seconds, then, a load was removed along the thickness direction at a rate of 2.2 mN/sec. The deformation amount at this point was measured by Fischer-scope H-100 manufactured by Fischer Instruments K.K. (using an indenter having a plane of 100 μm×100 μm, obtained by polishing a Vickers indenter (in the form of 4-sided pyramid)) to know the initial deformation amount T1, total deformation amount T2, plastic deformation amount T3 and elastic deformation amount T4 shown in FIG. 3, and the elastic deformation rate [(T4/T2)×100] and the initial deformation rate [(T1/T)×100] were calculated, and the results are shown in Table 1.

Next, glass substrates (1737 glass manufactured by Corning Corp.) of 300 mm×400 mm×0.7 mm (thickness) were prepared as the substrate for color filter. This substrate was washed according to an ordinary method, then, a shading layer (thickness: 0.1 μm) made of metal chromium was formed on the whole surface of one side of the substrate by a sputtering method. Then, a photosensitive resist was applied on this shading layer, exposed via a mask, developed and etched, and the resist layer was peeled, to form a black matrix, according to a usual photolithography method.

Subsequently, a photosensitive coloring material for red pattern (Color Mosaic CR-7001, manufactured by Fuji Film Orin K.K.) was applied by a spin coat method on the whole surface of a substrate on which the black matrix was formed, formed a red photosensitive resin layer, and pre-baked (85° C., 5 min.). Then, a red photosensitive resin layer was alignment-exposed using a predetermined photomask for coloring pattern, developed with a developer (diluted solution of a developer CD for color mosaic, manufactured by Fuji Film Orin K.K.). Then, post-bake (200° C., 30 min.) was conducted to form a red pattern (thickness: 1.5 μm) at predetermined position relative to the black matrix pattern.

Likewise, a green pattern (thickness: 1.5 μm) was formed at a given position relative to the black matrix pattern, using a photosensitive coloring material for green pattern (Color Mosaic CG-7001, manufactured by Fuji Film Orin K.K.). Further, a blue pattern (thickness: 1.5 μm) was formed at a predetermined position relative to the black matrix pattern, using a photosensitive coloring material for blue pattern (Color Mosaic CB-7001, manufactured by Fuji Film Orin K.K.).

Subsequently, on the substrate on which the colored layer was formed, a negative transparent photosensitive resin material (NN series manufactured by JSR Corporation) was applied by a spin coat method and exposed, to form a transparent protective layer having a thickness of 1.5 μm.

Then, a common transparent electrode layer composed of indium tin oxime (ITO) was formed on the protective layer.

Then on the above-mentioned transparent protective layer, the above-mentioned photosensitive resin composition 1-A of the present invention was applied by a spin coat method, and dried to form a photosensitive resin layer having a thickness of 5.4 μm. Then, the form was exposed at an exposure amount of 100 mJ/cm$^2$ via a photomask having an aperture part of given form at a columnar convex part formation position by proximity exposure equipment which has an extra-high pressure mercury lamp as a light source for an exposure. Then, the substrate was developed by immersion into a developer (aqueous solution containing 0.05% by weight of KOH) for 60 seconds, and washed, then, post-baked (230° C., 30 min.) in a clean oven. By such a series of treatments, a columnar convex part in the form of cylinder having a thickness of 5.0 μm and an upper end area of about 100 μm$^2$ was formed on the exposed position.

By this, a color filter (Sample 1-A) having a structure as shown in FIGS. 1 and 2 was obtained.

Further, color filters (Samples 1-B, 1-C, 1-D, 1-E) were obtained in the same manner as for the color filter Sample 1-A except that the photosensitive resin compositions 1-B, 1-C, 1-D and 1-E were used in stead of the photosensitive resin compositions 1-A.

On the other hand, glass substrates (1737 glass manufactured by Corning Corp.) of 300 mm×400 mm×0.7 mm (thickness) were prepared as the transparent substrate. This substrate was washed according to an ordinary method, then, a film transistor (TFT) was formed on a plurality of given positions on the substrate, and a transparent picture element electrode made of indium tin oxime (ITO) was so formed as to be connected to a drain electrode of each TFT, to give a facing electrode substrate.

Next, a polyimide resin paint (SE-7492, manufactured by Nissan Chemical Industries, Ltd.) was applied so as to cover the common transparent electrode layer of the above-mentioned color filters (Sample 1-A, 1-B, 1-C, 1-D, 1-E) and to cover the transparent picture element electrode of the facing electrode substrate, and dried to give an orientation layer (thickness: 0.07 μm), to complete the orientation treatment.

Then, a liquid crystal display was made using these color filters and the facing electrode substrate, and presence/absence of uneven color due to ununiformity of a clearance between substrates was observed, and the results are shown in Table 1 shown below.

TABLE 1

| Resin composition color filter | Monomer content (wt %) | Elastic deformation ratio (%) | Initial deformation ratio (%) | Uneven color |
|---|---|---|---|---|
| 1-A | 40 | 33 | 42 | Presence |
| 1-B | 50 | 40 | 27 | Absence |
| 1-C | 60 | 49 | 19 | Absence |
| 1-D | 70 | 59 | 11 | Absence |
| 1-E | 80 | 66 | 7 | Presence |

As shown in Table 1, the pattern samples formed by using the photosensitive resin compositions 1-B, 1-C and 1-D of the present invention had an elastic deformation rate [(elastic deformation amount/total deformation amount)×100] of from 40 to 60% and an initial deformation rate [(initial deformation amount/original thickness)×100] of from 10 to 30% at 180° C. Further, it was confirmed that the color filters having columnar convex parts formed by using these photosensitive resin compositions could be used for production of a liquid crystal display having excellent picture display.

Example 2

First, as the photosensitive resin composition, the following three photosensitive resin compositions 2-A, 2-B and 2-C were prepared in which the contents of a monomer is 60 wt %, and a sort of a monomer used is varied.

| Formulation of photosensitive resin composition 2-A | |
|---|---|
| Polymer (radical copolymer of styrene-methyl methacrylate-methacrylic acid) | 20 parts by weight |
| Poly-functional acrylate monomer (dipentaerythritol pentaacrylate (DPPA)) | 60 parts by weight |
| Photopolymerization initiator (Irgacure 369 (manufactured by Chiba Specialty Chemicals)) | 10 parts by weight |
| Epoxy resin (Epicoat 180S70 (manufactured by Mitsubishi Yuka Shell)) | 10 parts by weight |

| Formulation of photosensitive resin composition 2-B | |
|---|---|
| Polymer (radical copolymer of styrene-methyl methacrylate-methacrylic acid) | 20 parts by weight |
| Three-functional acrylate monomer (pentarythritol triacrylate) | 60 parts by weight |
| Photopolymerization initiator (Irgacure 369 (manufactured by Chiba Specialty Chemicals)) | 10 parts by weight |
| Epoxy resin (Epicoat 180S70 (manufactured by Mitsubishi Yuka Shell)) | 10 parts by weight |

| Formulation of photosensitive resin composition 2-C | |
|---|---|
| Polymer (radical copolymer of styrene-methyl methacrylate-methacrylic acid) | 20 parts by weight |
| Two-functional acrylate monomer (ethylene glycol diacrylate) | 60 parts by weight |
| Photopolymerization initiator (Irgacure 369 (manufactured by Chiba Specialty Chemicals)) | 10 parts by weight |
| Epoxy resin (Epicoat 180S70 (manufactured by Mitsubishi Yuka Shell)) | 10 parts by weight |

Next, regarding the above-mentioned photosensitive resin compositions (2-A, 2-B, 2-C), the initial deformation amount T1, total deformation amount T2, plastic deformation amount T3 and elastic deformation amount T4 were measured, and the elastic deformation rate [(T4/T2)×100] and the initial deformation rate [(T1/T)×100] were calculated, in the same manner as in Example 1, and the results are shown in Table 2.

Further, color filters (Sample 2-A, 2-B and 2-C) were produced in the same manner as in Example 1 using the above-mentioned photosensitive resin compositions (2-A, 2-B, 2-C). Liquid crystal displays were made in the same manner as in Example 1 using these color filters, and presence/absence of uneven color due to ununiformity of a clearance between substrates was observed, and the results are shown in Table 2 shown below.

TABLE 2

| Resin composition color filter | Elastic deformation ratio (%) | Initial deformation ratio (%) | Uneven color |
|---|---|---|---|
| 2-A | 51 | 17 | Absence |
| 2-B | 24 | 45 | Presence |
| 2-C | 19 | 49 | Presence |

As shown in Table 2, the pattern sample formed by using the photosensitive resin composition 2-A of the present invention using a poly-functional acrylate monomer had an elastic deformation rate [(elastic deformation amount/total deformation amount)×100] of from 40 to 60% and an initial deformation rate [(initial deformation amount/original thickness)×100] of from 10 to 30% at 180° C. Further, it was confirmed that the color filters having columnar convex parts formed by using these photosensitive resin compositions could be used for production of a liquid crystal display having excellent picture display.

However, color filters having columnar convex parts formed by using the photosensitive resin compositions 2-B and 2-C using as acrylate monomer having less than three functions manifested a large plastic deformation amount in the columnar convex part, and production of a liquid crystal display having excellent picture display was difficult.

Example 3

First, as the alicyclic compound-containing resin, a (methyladamantyl methacrylate)-(methacrylic acid)-(cyclohexyl methacrylate) copolymer was prepared by radical polymerization. The content of an alicyclic compound in this alicyclic compound-containing resin was 25% by weight.

Next, the following photosensitive resin composition 3-A was prepared using this alicyclic compound-containing resin.

| Formulation of photosensitive resin composition 3-A | |
|---|---|
| Polymer (radical copolymer of styrene-methyl methacrylate-methacrylic acid) | 10 parts by weight |
| Monomer (dipentarythritol hexaacrylate) | 28 parts by weight |
| Photopolymerization initiator (Irgacure 369 (manufactured by Chiba Specialty Chemicals)) | 8 parts by weight |
| Alicyclic compound-containing resin | 40 parts by weight |
| Epoxy resin (Epolead GT401 (manufactured by Daicell Chemical Industries, Ltd.)) | 14 parts by weight |
| Solvent (propylene glycol monomethyl ether acetate) | 300 parts by weight |

For comparison, a (styrene)-(methacrylic acid)-(benzyl methacrylate) copolymer was prepared by radical polymerization instead of the above-mentioned alicyclic compound-containing resin, and a photosensitive resin composition 3-B was prepared in the same manner as for the photosensitive resin composition 3-A except that the resulted copolymer was used.

Next, regarding the above-mentioned photosensitive resin compositions (3-A, 3-B), the initial deformation amount T1, total deformation amount T2, plastic deformation amount T3 and elastic deformation amount T4 were measured, and the elastic deformation rate [(T4/T2)×100] and the initial deformation rate [(T1/T)×100] were calculated, in the same manner as in Example 1, and the results are shown in Table 3.

Further, color filters (Sample 3-A, 3-B) were produced in the same manner as in Example 1 using the above-mentioned photosensitive resin compositions (3-A, 3-B). Liquid crystal displays were made in the same manner as in Example 1 using these color filters, and presence/absence of uneven color due to ununiformity of a clearance between substrates was observed, and the results are shown in Table 3 shown below.

TABLE 3

| Resin composition color filter | Elastic deformation ratio (%) | Initial deformation ratio (%) | Uneven color |
|---|---|---|---|
| 3-A | 51 | 23 | Absence |
| 3-B | 29 | 45 | Presence |

As shown in Table 3, the pattern sample formed by using the photosensitive resin composition 3-A of the present invention containing an alicyclic compound-containing resin had an elastic deformation rate [(elastic deformation amount/total deformation amount)×100] of from 40 to 60% and an initial deformation rate [(initial deformation amount/original thickness)×100] of from 10 to 30% at 180° C. Further, it was confirmed that the color filters having columnar convex parts formed by using these photosensitive resin compositions could be used for production of a liquid crystal display having excellent picture display.

However, a color filter having columnar convex parts formed by using the photosensitive resin composition 3-B containing no alicyclic compound-containing resin manifested a large plastic deformation amount in the columnar convex part, and production of a liquid crystal display having excellent picture display was difficult.

Example 4

First, as the alicyclic compound-containing resin, a (methyl methacrylate)-(methacrylic acid)-(methyladamantyl methacrylate) copolymer was prepared by radical polymerization. The content of an alicyclic compound in this alicyclic compound-containing resin was 31% by weight.

Next, the following photosensitive resin composition 4-A was prepared using this alicyclic compound-containing resin.

| Formulation of photosensitive resin composition 4-A | |
|---|---|
| Polymer (radical copolymer of styrene-methyl methacrylate-methacrylic acid) | 10 parts by weight |
| Monomer (dipentaerythritol hexaacrylate) | 28 parts by weight |
| Photopolymerization initiator (Irgacure 369 (manufactured by Chiba Specialty Chemicals)) | 8 parts by weight |
| Alicyclic compound-containing resin | 40 parts by weight |
| Epoxy resin (Epicoat 180S70 (manufactured by Mitsubishi Yuka Shell)) | 14 parts by weight |
| Solvent (propylene glycol monomethyl ether acetate) | 300 parts by weight |

For comparison, a (styrene)-(methacrylic acid)-(methyl methacrylate) copolymer was prepared by radical polymerization instead of the above-mentioned alicyclic compound-containing resin, and a photosensitive resin composition 4-B was prepared in the same manner as for the photosensitive resin composition 4-A except that the resulted copolymer was used.

Next, regarding the above-mentioned photosensitive resin compositions (4-A, 4-B), the initial deformation amount T1, total deformation amount T2, plastic deformation amount T3 and elastic deformation amount T4 were measured, and the elastic deformation rate [(T4/T2)×100] and the initial deformation rate [(T1/T)×100] were calculated, in the same manner as in Example 1, and the results are shown in Table 4.

Further, color filters (Sample 4-A, 4-B) were produced in the same manner as in Example 1 using the above-mentioned photosensitive resin compositions (4-A, 4-B). Liquid crystal displays were made in the same manner as in Example 1 using these color filters, and presence/absence of uneven color due to ununiformity of a clearance between substrates was observed, and the results are shown in Table 4 shown below.

TABLE 4

| Resin composition color filter | Elastic deformation ratio (%) | Initial deformation ratio (%) | Uneven color |
|---|---|---|---|
| 4-A | 49 | 27 | Absence |
| 4-B | 25 | 47 | Presence |

As shown in Table 4, the pattern sample formed by using the photosensitive resin composition 4-A of the present invention containing an alicyclic compound-containing resin had an elastic deformation rate [(elastic deformation amount/total deformation amount)×100] of from 40 to 60% and an initial deformation rate [(initial deformation amount/original thickness)×100] of from 10 to 30% at 180° C. Further, it was confirmed that the color filters having columnar convex parts formed by using these photosensitive resin compositions could be used for production of a liquid crystal display having excellent picture display.

However, a color filter having columnar convex parts formed by using the photosensitive resin composition 4-B containing no alicyclic compound-containing resin manifested a large plastic deformation amount in the columnar convex part, and production of a liquid crystal display having excellent picture display was difficult.

Example 5

First, as the alicyclic compound-containing resin, a (methyl methacrylate)-(methacrylic acid)-(isonorbornyl methacrylate) copolymer was prepared by radical polymerization. The content of an alicyclic compound in this alicyclic compound-containing resin was 35% by weight.

Next, the following photosensitive resin composition 5-A was prepared using this alicyclic compound-containing resin.

| Formulation of photosensitive resin composition 5-A | |
|---|---|
| Polymer (radical copolymer of styrene-methyl methacrylate-methacrylic acid) | 10 parts by weight |
| Monomer (dipentaerythritol pentaacrylate) | 35 parts by weight |
| Photopolymerization initiator (Irgacure 369 (manufactured by Chiba Specialty Chemicals)) | 12 parts by weight |
| Alicyclic compound-containing resin | 37 parts by weight |
| Epoxy resin (Epolead GT401, manufactured by Daicell Chemical Industries, Ltd.) | 6 parts by weight |
| Solvent (propylene glycol monomethyl ether acetate) | 300 parts by weight |

For comparison, a (styrene)-(methacrylic acid)-(methyl methacrylate) copolymer was prepared by radical polymerization instead of the above-mentioned alicyclic compound-containing resin, and a photosensitive resin composition 5-B was prepared in the same manner as for the photosensitive resin composition 5-A except that the resulted copolymer was used.

Next, regarding the above-mentioned photosensitive resin compositions (5-A, 5-B), the initial deformation amount T1, total deformation amount T2, plastic deformation amount T3 and elastic deformation amount T4 were measured, and the elastic deformation rate [(T4/T2)×100] and the initial deformation rate [(T1/T)×100] were calculated, in the same manner as in Example 1, and the results are shown in Table 5.

Further, color filters (Sample 5-A, 5-B) were produced in the same manner as in Example 1 using the above-mentioned photosensitive resin compositions (5-A, 5-B) Liquid crystal displays were made in the same manner as in Example 1 using these color filters, and presence/absence of uneven color due to ununiformity of a clearance between substrates was observed, and the results are shown in Table 5 shown below.

TABLE 5

| Resin composition color filter | Elastic deformation ratio (%) | Initial deformation ratio (%) | Uneven color |
|---|---|---|---|
| 5-A | 56 | 15 | Absence |
| 5-B | 35 | 34 | Presence |

As shown in Table 5, the pattern sample formed by using the photosensitive resin composition 5-A of the present invention containing an alicyclic compound-containing resin had an elastic deformation rate [(elastic deformation amount/total deformation amount)×100] of from 40 to 60% and an initial deformation rate [(initial deformation amount/ original thickness)×100] of from 10 to 30% at 180° C. Further, it was confirmed that the color filters having columnar convex parts formed by using these photosensitive resin compositions could be used for production of a liquid crystal display having excellent picture display.

However, a color filter having columnar convex parts formed by using the photosensitive resin composition 5-B containing no alicyclic compound-containing resin manifested a large plastic deformation amount in the columnar convex part, and production of a liquid crystal display having excellent picture display was difficult.

Example 6

As two sorts of the alicyclic compound-containing resins A and B, a (methyl methacrylate)-(methacrylic acid)-(tricyclodecanyl methacrylate) copolymers were prepared by radical polymerization. The content of an alicyclic compound in this alicyclic compound-containing resin A was 15% by weight, and the content of an alicyclic compound in this alicyclic compound-containing resin B was 35% by weight.

Next, the following photosensitive resin compositions 6-A and 6-B were prepared using these alicyclic compound-containing resins A and B.

| Formulation of photosensitive resin composition 6-A (6-B) | |
|---|---|
| Polymer (radical copolymer of styrene-methyl methacrylate-methacrylic acid) | 10 parts by weight |
| Monomer (dipentaerythritol pentaacrylate) | 35 parts by weight |

-continued

| Formulation of photosensitive resin composition 6-A (6-B) | |
|---|---|
| Photopolymerization initiator (Irgacure 369 (manufactured by Chiba Specialty Chemicals)) | 12 parts by weight |
| Alicyclic compound-containing resin A (B) | 39 parts by weight |
| Epoxy resin (Eporead GT401, manufactured by Daicell Chemical Industries, Ltd.) | 4 parts by weight |
| Solvent (propylene glycol monomethyl ether acetate) | 300 parts by weight |

For comparison, a (styrene)-(methacrylic acid)-(methyl methacrylate) copolymer was prepared by radical polymerization instead of the above-mentioned alicyclic compound-containing resin, and a photosensitive resin composition 6-c was prepared in the same manner as for the photosensitive resin compositions 6-A and 6-B except that the resulted copolymer was used.

Next, regarding the above-mentioned photosensitive resin compositions (6-A, 6-B and 6-C), the initial deformation amount T1, total deformation amount T2, plastic deformation amount T3 and elastic deformation amount T4 were measured, and the elastic deformation rate [(T4/T2)×100] and the initial deformation rate [(T1/T)×100] were calculated, in the same manner as in Example 1, and the results are shown in Table 6.

Further, color filters (Sample 6-A, 6-B and 6-C) were produced in the same manner as in Example 1 using the above-mentioned photosensitive resin compositions (6-A, 6-B and 6-C). Liquid crystal displays were made in the same manner as in Example 1 using these color filters, and presence/absence of uneven color due to ununiformity of a clearance between substrates was observed, and the results are shown in Table 6 shown below.

TABLE 6

| Resin composition color filter | Elastic deformation ratio (%) | Initial deformation ratio (%) | Uneven color |
|---|---|---|---|
| 6-A | 53 | 27 | Absence |
| 6-B | 57 | 13 | Absence |
| 6-C | 36 | 31 | Presence |

As shown in Table 6, the pattern samples formed by using the photosensitive resin compositions 6-A and 6-B of the present invention containing an alicyclic compound-containing resin had an elastic deformation rate [(elastic deformation amount/total deformation amount)×100] of from 40 to 60% and an initial deformation rate [(initial deformation amount/original thickness)×100] of from 10 to 30% at 180° C. Further, it was confirmed that the color filters having columnar convex parts formed by using these photosensitive resin compositions could be used for production of a liquid crystal display having excellent picture display.

However, a color filter having columnar convex parts formed by using the photosensitive resin composition 6-C containing no alicyclic compound-containing resin manifested a large plastic deformation amount in the columnar convex part, and production of a liquid crystal display having excellent picture display was difficult.

Example 7

First, as the alicyclic compound-containing resin, a (methyladamantyl methacrylate)-(methacrylic acid)-

(cyclohexyl methacrylate) copolymer was prepared by radical polymerization. The content of an alicyclic compound in this alicyclic compound-containing resin was 25% by weight.

Next, the following photosensitive resin composition 7-A was prepared using this alicyclic compound-containing resin.

| Formulation of photosensitive resin composition 7-A | |
| --- | --- |
| Polymer (radical copolymer of styrene-methyl methacrylate-methacrylic acid) | 10 parts by weight |
| Monomer (dipentaerythritol pentaacrylate) | 34 parts by weight |
| Photopolymerization initiator (Irgacure 369 (manufactured by Chiba Specialty Chemicals)) | 13 parts by weight |
| Alicyclic compound-containing resin | 43 parts by weight |
| Solvent (propylene glycol monomethyl ether acetate) | 300 parts by weight |

For comparison, a (styrene)-(methacrylic acid)-(benzyl methacrylate) copolymer was prepared by radical polymerization instead of the above-mentioned alicyclic compound-containing resin, and a photosensitive resin composition 7-B was prepared in the same manner as for the photosensitive resin composition 7-A except that the resulted copolymer was used.

Next, regarding the above-mentioned photosensitive resin compositions (7-A, 7-B), the initial deformation amount T1, total deformation amount T2, plastic deformation amount T3 and elastic deformation amount T4 were measured, and the elastic deformation rate [(T4/T2)×100] and the initial deformation rate [(T1/T)×100] were calculated, in the same manner as in Example 1, and the results are shown in Table 7.

Further, color filters (Sample 7-A, 7-B) were produced in the same manner as in Example 1 using the above-mentioned photosensitive resin compositions (7-A, 7-B). Liquid crystal displays were made in the same manner as in Example 1 using these color filters, and presence/absence of uneven color due to ununiformity of a clearance between substrates was observed, and the results are shown in Table 7 shown below.

TABLE 7

| Resin composition color filter | Elastic deformation ratio (%) | Initial deformation ratio (%) | Uneven color |
| --- | --- | --- | --- |
| 7-A | 55 | 20 | Absence |
| 7-B | 36 | 31 | Presence |

As shown in Table 7, the pattern sample formed by using the photosensitive resin composition 7-A of the present invention containing an alicyclic compound-containing resin had an elastic deformation rate [(elastic deformation amount/total deformation amount)×100] of from 40 to 60% and an initial deformation rate [(initial deformation amount/original thickness)×100] of from 10 to 30% at 180° C. Further, it was confirmed that the color filters having columnar convex parts formed by using these photosensitive resin compositions could be used for production of a liquid crystal display having excellent picture display.

However, a color filter having columnar convex parts formed by using the photosensitive resin composition 7-b containing no alicyclic compound-containing resin manifested a large plastic deformation amount in the columnar convex part, and production of a liquid crystal display having excellent picture display was difficult.

What is claimed is:

1. A liquid crystal display color filter comprising a substrate, a colored layer of a plurality of colors formed on the substrate in a predetermined pattern, and a plurality of columnar convex parts, wherein the columnar convex part manifests an elastic deformation ratio [(elastic deformation amount/total deformation amount)×100] ranging from 40 to 60% and an initial deformation ratio [(initial deformation amount/original thickness)×100] ranging from 10 to 30%, at a temperature of 180° C.

2. A photosensitive resin composition for forming pattern, comprising at least a polymer, a poly-functional acrylate monomer and a photopolymerization initiator, wherein the content of said poly-functional acrylate monomer is from 50 to 70% by weight.

3. A photosensitive resin composition for forming pattern, comprising at least a polymer, a monomer having an unsaturated double bond, a photopolymerization initiator, and an alicyclic compound-containing resin, wherein the alicyclic compound-containing resin contains, as an alicyclic compound, a compound having a poly-cyclic steric structure.

4. The photosensitive resin composition according to claim 3, wherein said alicyclic compound-containing resin is obtained by polymerizing a monomer to which a vinyl group and/or isopropenyl group is added with said alicyclic compmound.

5. The photosensitive resin composition according to claim 4, wherein said monomer is a poly-functional acrylate monomer and said vinyl group and/or isopropenyl group carries a carboxyl group on one of double bond carbons.

6. The photosensitive resin composition according to claim 2, wherein the composition contains an epoxy compound.

7. The photosensitive resin composition according to claim 3, wherein the composition contains an epoxy compound.

8. The photosensitive resin composition according to claim 4, wherein the composition contains an epoxy compound.

9. The photosensitive resin composition according to claim 5, wherein the composition contains an epoxy compound.

* * * * *